US 6,593,782 B2

(12) United States Patent
Pierschel et al.

(10) Patent No.: US 6,593,782 B2
(45) Date of Patent: Jul. 15, 2003

(54) STATIC FREQUENCY DIVIDER WITH A DIVIDER RATIO WHICH CAN BE SWITCHED OVER

(75) Inventors: Michael Pierschel, Berlin (DE); Hans Gustat, Berlin (DE)

(73) Assignee: Institut fuer Halbleiterphysik Frankfurt (Oder) GmbH, Frankfurt (DE)

(*) Notice: Subject to any disclaimer, the term of this patent is extended or adjusted under 35 U.S.C. 154(b) by 0 days.

(21) Appl. No.: 09/805,488

(22) Filed: Mar. 13, 2001

(65) Prior Publication Data

US 2002/0079936 A1 Jun. 27, 2002

(30) Foreign Application Priority Data

Mar. 18, 2000 (DE) .......................... 100 13 633

(51) Int. Cl.[7] .............................. H03K 21/00
(52) U.S. Cl. ........................ 327/115; 327/117
(58) Field of Search ................. 327/115, 117; 377/47, 48

(56) References Cited

U.S. PATENT DOCUMENTS

| 4,380,736 A | | 4/1983 | Pfaff | |
|---|---|---|---|---|
| 4,394,769 A | * | 7/1983 | Lull | ............ 377/48 |
| 4,656,649 A | | 4/1987 | Takahashi | |
| 5,121,417 A | | 6/1992 | Swierczek | |
| 5,206,547 A | | 4/1993 | Houghten | |
| 6,014,047 A | * | 1/2000 | Dreps et al. | ............ 327/156 |
| 6,282,255 B1 | * | 8/2001 | La Rosa et al. | ............ 377/47 |

FOREIGN PATENT DOCUMENTS

| DE | 24 50 920 A | 4/1976 |
|---|---|---|
| DE | 35 44 820 C2 | 9/1987 |
| DE | 42 32 609 A1 | 3/1994 |
| DE | 42 25 388 C2 | 8/1996 |
| DE | 198 48 300 A1 | 4/2000 |
| JP | 0005090952 AA | 4/1993 |
| WO | WO00/01071 A1 | 1/2000 |

OTHER PUBLICATIONS

Craninckx, et al., "A 1.75–GHz/3–V Dual Modulus Divide–by–128/129 Prescaler in 0.7 micron CMOS," IEEE J. of Solid State Circuits, IEEE, vol. 31 (No. 7), p. 890–7, (Jul. 1, 1996).

Hirakata, et al, "3 V–Operation GaAs Prescaler IC with Power Saving Function," IEICE Trans. Electron., vol. E75 (No. 10), p. 1115–20, (Oct. 21, 1992).

Piazza, et al., "A Low Power CMOS Dual Modulus Prescaler for Frequency Synthesizers," IEICE Trans. Electron., vol. E80 (No. 2), p. 314–9, (Feb. 21, 1997).

* cited by examiner

Primary Examiner—Kenneth B. Wells
(74) Attorney, Agent, or Firm—Hahn Loeser + Parks LLP; Stephen L. Grant

(57) ABSTRACT

The invention is a static frequency divider with a divider ratio which can be switched over, tor use in the extremely high frequency range. In a preferred embodiment, the invention is a static frequency divider with a divider ratio which can be switched over, which includes first and second divider D- type flip-flops which each have two inputs which can be alternately activated by way of control inputs, in order to prevent the occurrence of metastable conditions. This is accomplished by connecting the successive synchronous D-type flip-flops upstream of the two divider D-type flip- flops and the control inputs of the first and second divider D-type flip-flops are connected to separate change-over switching devices.

4 Claims, 2 Drawing Sheets

STATIC FREQUENCY DIVIDER WITH A DIVIDER RATIO WHICH CAN BE SWITCHED OVER

Figure 1:
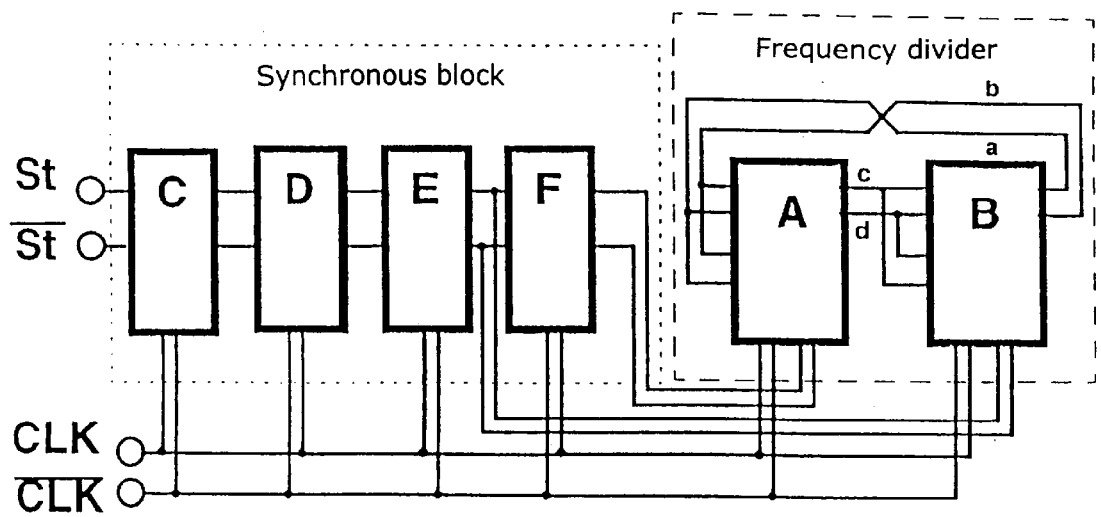

The invention concerns a static frequency divider with a divider ratio which can be switched over, for use in the extremely high frequency range.

Binary frequency dividers are a crucial component in frequency synthesizers as are employed in integrated transmitting and receiving circuits.

Usually, frequency dividers comprise a synchronous binary divider and logic blocks connected at the upstream side, for setting the desired division ratio. Circuit arrangements of that kind are described in IEICE Trans. Electron, Vol. E 80-C, No.2, pages 314-319, Feb. 1997 and IEICE Trans. Electron, Vol. E 75-C, No.10, 5. 1115-1120, Oct. 1992. In that respect the delay caused by the logic blocks represents a fundamental speed limitation as the logical decision must be taken before the following clock input signal is received. That additional delay limits the maximum clock frequency. In addition the necessary driver and logic circuits cause relatively high power losses as the signal levels used are only in the range of between 200 and 500 mV and corresponding level lifting is required.

An attempt to overcome that limitation is based on the principle of phase rotation selection which permits the design of asynchronous high speed circuits with a division ratio of 2, see IEEE Journal of Solid State Circuits, Vol. 31, No. 7, 5.890-897, July 1996. Admittedly that principle overcomes the limiting delay, but in this case also additional level drivers and logic circuits with corresponding power losses are required.

DE 198 48 300 also describes a circuit arrangement for a static frequency divider with a divider ratio which can be switched over, for which no additional level drivers and logic circuits are required. In this case, two divider D-type flip-flops which are modified by additional input transistor pairs and switching transistors are provided in a divider stage. A change-over switching device is connected in parallel to the two control inputs of the divider D-type flip-flops. When the operating current of the pairs of input transistors is switched over, precisely one input clock period is suppressed and thus the corresponding output clock period is prolonged. Virtually any desired divider ratios can be implemented by means of further divider stages with divider D-type flip-flops of that kind and by virtue of a plurality of change-over switching operations.

It has been found that this circuit arrangement suffers from the disadvantage that, at high frequencies, there is a dependency of the function on the delay times which are internal to the circuit. Thus, the change-over switching signal can occur precisely at a time which is so unfavorable that metastable conditions are the consequence. In that case the circuit arrangement, after the occurrence of the change-over switching edge, cannot sufficiently rapidly decide which level is to be set.

In a static frequency divider with a divider ratio which can be switched over, with first and second divider D-type flip-flops which each have two inputs which can be activated alternately by way of control inputs, the object of the invention is to prevent the occurrence of metastable conditions and thus to ensure reliable operation up to extremely high frequencies. Finally the object of the invention is so to design the circuit arrangement that it can be implemented in all relevant technologies of semiconductor engineering.

In accordance with the invention that object is attained in that, in a static frequency divider with a divider ratio which can be switched over, including a first and a second divider D-type flip-flop each having two inputs which can be activated alternately by way of control inputs, successive synchronous D-type flip-flops are connected upstream of the two divider D-type flip-flops and the control inputs of the first and second divider D-type flip-flops are connected to separate change-over switching devices. Advantageously, the control inputs of the first and second divider D-type flip-flops are connected to separate control outputs of the successive synchronous D-type flip-flops. Preferably the control input of the first divider D-type flip-flop is connected to the control output of one of the successive synchronous D-type flip-flops and the control input of the second divider D-type flip-flop is connected to the control output of the preceding synchronous D-type flip-flop.

The teaching of the structure in accordance with the invention is based on the consideration that, in a synchronously cyclically controlled chain of D-type flip-flops, by means of the clock, it is possible to determine with a very high degree of accuracy when which "master" and when which "slave" of a D-type flip-flop is switched active. In that way the change-over switching action can be shifted precisely to the times at which it is certain that the occurrence of metastable conditions after the change-over switching operation is prevented. That is implemented by virtue of the fact that the first and second divider D-type flip-flops are switched over not at the same time but separately, more specifically in displaced relationship precisely by half an input clock period. In that case, the change-over switching action takes place in each case at a moment in time at which the input associated with that divider D-type flip-flop is not switched on.

The advantages of the structure according to the invention are essentially that virtually a doubling of the upper frequency limit that can be reached is achieved, while the power consumption or drain is approximately halved. When a power loss which is usual for the state of the art is demanded, approximately a doubling of the upper limit frequency which can be achieved would be possible. The circuit arrangement according to the invention can be carried into effect independently of the available technology, for example using CMOS, DMOS or bipolar designs.

Figure 2:
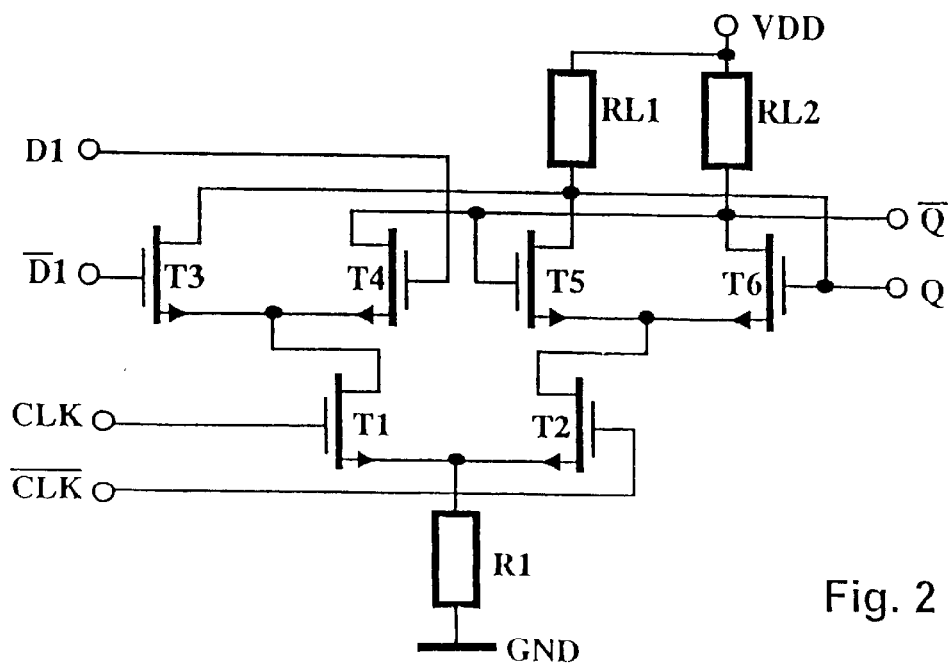
Figure 3:
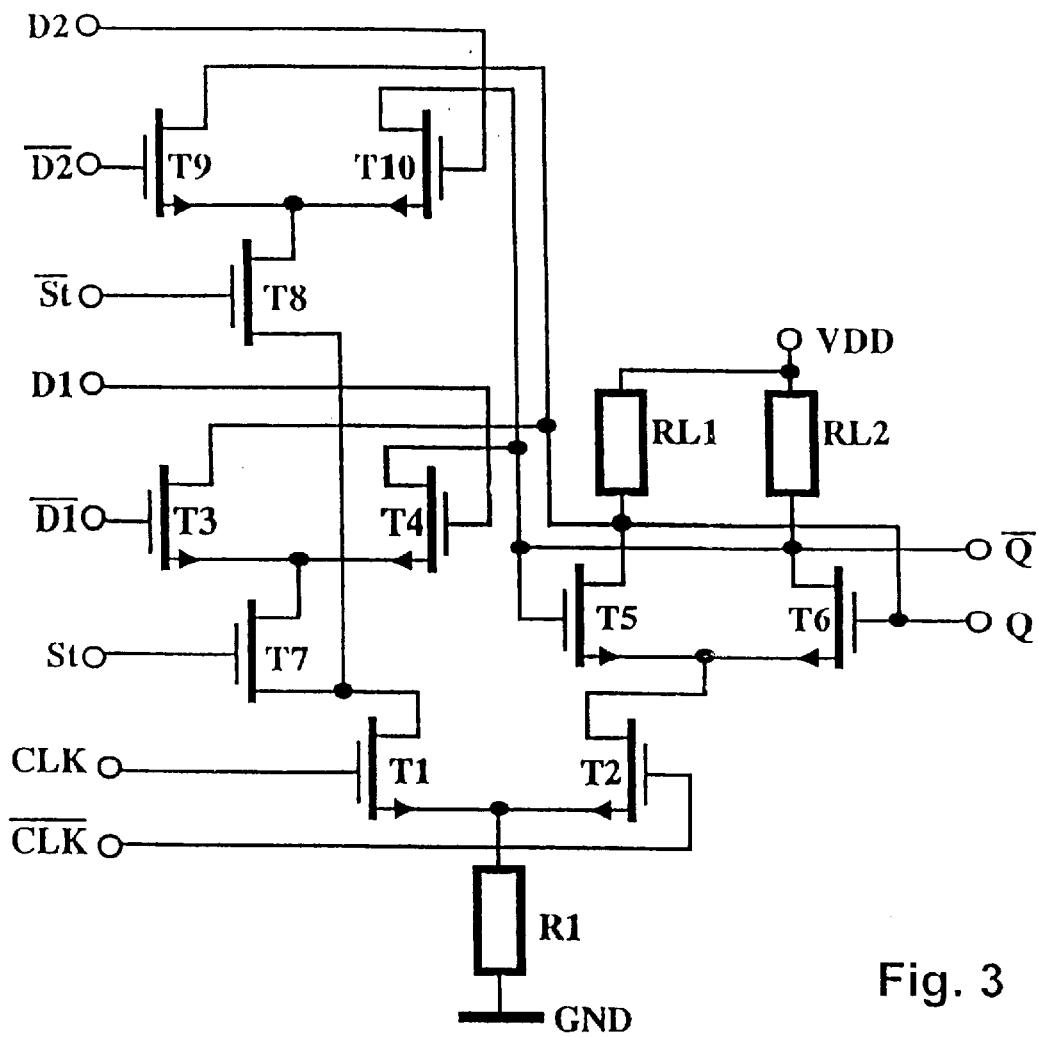
Figure 4:
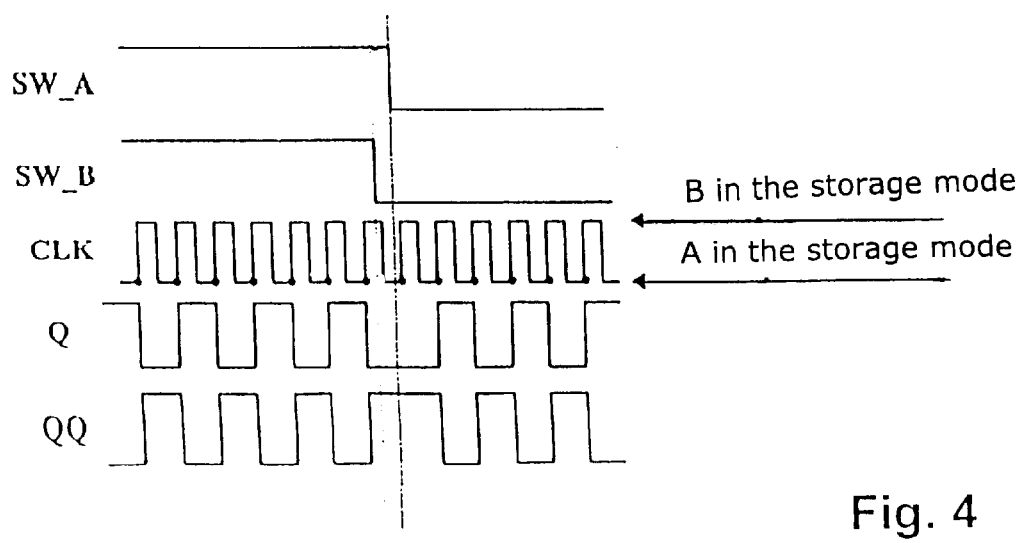

Besides being set forth in the claims, the features of the invention are also set forth in the description and the drawings, in which respect the individual features on their own or in pluralities in the form of sub-combinations respectively represent patentable configurations for which protection is claimed herein. An embodiment by way of example of the invention is described in greater detail hereinafter and illustrated in the drawing in which:

FIG. 1 shows a block circuit diagram of the frequency divider according to the invention, FIG. 2 shows a circuit arrangement of the synchronous D-type flip-flops of the frequency divider, FIG. 3 shows the circuit arrangement of the divider D-type flip-flops of the frequency divider, and FIG. 4 shows a cyclic operating diagram.

FIG. 1 shows the block circuit diagram of the static frequency divider according to the invention, with a first and a second divider D-type flip-flop A, B and successive synchronous D-type flip-flops C, D, E, F. Both the divider D-type flip-flops A, B and also the synchronous D-type flip-flops C, D, E, F are connected to a clock frequency input CLK, CLK'. The train of the successive synchronous D-type flip-flops C, D, E, F is connected with a control input St, St' to a change-over switching device. Lines are identified by a, b, c, d to characterize the signal configurations.

FIG. 2 shows the circuit arrangement of the successive synchronous D-type flip-flops C, D, E, F in CMOS CML technology with an input D, D', a control output Q, Q' at which a respective change-over switching signal SW occurs and the input of the clock frequency CLK, CLK'.

FIG. 3 shows the circuit arrangement of the first and second divider D-type flip-flops A, B respectively using CMOS CML technology, with two alternately activatable inputs D1, D1', D2, D2'. The change-over switching operation is effected by way of the control input St, St' by means of the change-over switching signals SW of the respectively connected synchronous D-type flip-flops E, F. The clock frequency is applied to the input CLK, CLK' while the output signal Q, QQ of the frequency divider appears at the control output Q, Q'.

FIG. 4 shows a cyclic operating diagram of the structure according to the invention in which:

SW A is the change-over switching signal of the synchronous D-type flip-flop F connected to the divider D-type flip-flop A, SW B is the change-over switching signal of the synchronous D-type flip-flop E connected to the divider D-type flip-flop B, CLK is the clock frequency, and Q, QQ is the divided output signal of the frequency divider.

The mode of operation of the static frequency divider according to the invention is described hereinafter with reference to FIGS. 1 through 4.

The first and second divider D-type flip-flops A, B are shown in FIG. 1. They form a first divider ring by virtue of the fact that the control outputs Q, Q' of the first divider D-type flip-flop A, which carry a c-signal and a d-signal, are connected to the inputs D1, D1' of the second divider D-type flip-flop B, and the control outputs Q, Q' of the second divider D-type flip-flop B, which carry an a-signal and a b-signal, are connected, as a result of signal crossing, to the respective inverting inputs D1', D1 of the first divider D-type flip-flop A. A second divider ring is formed by virtue of the fact that the respective second inputs D2, D2' of the first and second divider D-type flip-flops A, B are connected to the respective inverting first inputs D1', D1. The clock signal is fed to the two divider D-type flip-flops A, B by way of the parallel-connected clock inputs CLK, CLK'. The control input St, St' of the first divider D-type flip-flop A is connected to the control output Q, Q' of the last synchronous D-type flip-flop F and the control input St, St' of the second divider D-type flip-flop B is connected to the control output Q, Q' of the preceding synchronous D-type flip-flop E.

The first of the successive synchronous D-type flip-flops C, D, E, F is connected with its control input St, St' to a change-over switching device (not shown). In this embodiment, the first two synchronous D-type flip-flops C, D serve exclusively for edge steepening and pass the change-over switching signal SW with the clock signal CLK to the following synchronous D-type flip-flops E, F. C, D can be omitted for very low frequencies. St, St' are then to be connected directly to E.

FIG. 2 shows the circuit arrangement of the successive synchronous D-type flip-flops C, D, E, F. This per se known circuit involves the existence of only one input D, D' and one control output Q, Q' in a so-called master-slave arrangement with the transistors T3, T4 and T5, T6.

FIG. 3 shows the modified circuit arrangement of the divider D-type flip-flops A, B. Besides a first pair of input transistors T3, T4 of the first input D1, D1', there is a second pair of input transistors T9, T10 for the second input D2, D2'. The first pair of input transistors T3, T4 is controlled by way of a first change-over switching transistor T7 whose gate is connected to the control input St. In a corresponding fashion the second pair of input transistors T9, T10 is controlled by way of a second change-over switching transistor T8 whose gate is connected to the inverting control input St'. A respective terminal of the input transistors T3 and T9 is connected to the control output Q and the corresponding terminals of the input transistors T4 and T10 are connected to the inverting control output Q'. In this case the transistors T5 and T6 form a bistable trigger stage which causes the control output Q, Q' to remain in the respectively actuated condition.

FIG. 4 shows hereinafter the cyclic procedure involved in the structure according to the invention in the event of a signal change in respect of the change-over switching device at the control input St, St' of the chain of the successive synchronous D-type flip-flops C, D, E, F. In regard to the clock frequency CLK the beginning of each period is characterized by a dot. With each successive edge of the clock signal CLK the logic level of the output signal Q, QQ of the frequency divider changes so that a division ratio of 2:1 is afforded in a mode of operation without a signal change in respect of the change-over switching device at the control input St, St' of the chain of successive synchronous D-type flip-flops C, D, E, F. The change-over switching signals SW A, SW B change their level states in the event of a signal change in respect of the changeover switching device at the control input St, St' of the chain of successive synchronous D-type flip-flops C, D, E, F. The edges thereof are delayed with respect to the edges of the clock frequency and their mutual spacing is precisely half a clock period. That means that the level change in respect of the change-over switching signals SW A, SW B is terminated within precisely one clock period. A level change in the output signal Q, QQ of the frequency divider does not occur whenever, in the preceding clock period CLK, both change-over switching signals SW A, SW B have experienced a change in level. As however with the beginning of each period of the clock signal CLK a decision is made as to whether the output signal Q, QQ does or does not experience a change in level, the structure according to the invention of the frequency divider practically excludes the occurrence of metastable conditions.

The static frequency divider according to the invention as shown in FIG. 1 therefore avoids the occurrence of metastable conditions insofar as the control output Q, Q' of the last synchronous D-type flip-flop F is connected to the control input St, St' of the first divider D-type flip-flop A and the control output Q, Q' of the preceding synchronous D-type flip-flop E is connected to the control input St, St' of the second divider D-type flip-flop B. In that way, change-over switching of the masters of the divider D-type flip-flops A, B, as can be seen from the cyclic operating diagram, is no longer implemented simultaneously but separately and in time-displaced relationship. That is reliably possible in particular for the reason that, in the synchronously cycled chain of synchronous D-type flip-flops C, D, E, F, the moment in time at which one of the masters is without a function is precisely established and the change-over switching operation can occur at that time by means of another synchronous D-type flip-flop C, D, E, F which is active precisely at that time. In the case of measurements on prototypes of a 16/17-divider and a 32/33-divider which were constructed in the form of a 0.4 μm CMOS-design, it was possible to demonstrate a power consumption of less than 20 mW in the range of up to 2.4 GHz and 21.7 mW at 2.825 GHz respectively.

The static frequency divider according to the invention was described hereinbefore by means of a specific example thereof. It should be noted however that the present invention is not limited to the details of the description in respect of the specific embodiment as modifications and alterations are claimed within the scope of the claims.

What is claimed is:

1. A static frequency divider with a divider ratio, comprising:
    a first and a second divider D-type flip-flop, each said divider D-type flip-flop having two inputs that are alternately activated by way of control inputs; and
    successive synchronous D-type flip-flops, defining at least two change-over switching devices, the successive synchronous flip-flops being connected upstream of the two divider D-type flip-flops,
    wherein the control input of the first divider D-type flip-flop is connected to a first of the at least two change-over switching devices and the control input of the second divider-type flip-flops is connected to another of the at least two change-over switching devices.

2. The static frequency divider of claim 1, wherein the control inputs of the first and second divider D-type flip-flops are connected to separate control outputs of the successive synchronous D-type flip-flops.

3. The static frequency divider of claim 1, wherein the control input of the first divider D-type flip-flop is connected to the control output of one of the successive synchronous D-type flip-flops and the control input of the second divider D-type flip-flop is connected to the control output of the preceding synchronous D-type flip-flop 4. The static frequency divider of claim 2, wherein the control input of the first divider D-type flip-flop is connected to the control output of one of the successive synchronous D-type flip-flops and the control input of the second divider D-type flip-flop is connected to the control output of the preceding synchronous D-type flip-flop.

* * * * *